(12) United States Patent
Nomura

(10) Patent No.: US 7,592,119 B2
(45) Date of Patent: Sep. 22, 2009

(54) PHOTOSENSITIVE POLYIMIDE RESIN COMPOSITION

(75) Inventor: Mamiko Nomura, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 12/226,822

(22) PCT Filed: Jan. 23, 2008

(86) PCT No.: PCT/JP2008/050896

§ 371 (c)(1),
(2), (4) Date: Oct. 29, 2008

(87) PCT Pub. No.: WO2008/096601

PCT Pub. Date: Aug. 14, 2008

(65) Prior Publication Data

US 2009/0075198 A1    Mar. 19, 2009

(30) Foreign Application Priority Data

Feb. 9, 2007    (JP) .............................. 2007-031246

(51) Int. Cl.
G03F 7/023    (2006.01)
G03F 7/30    (2006.01)
(52) U.S. Cl. .................. 430/191; 430/192; 430/193; 430/270.1; 430/311; 430/325; 430/330
(58) Field of Classification Search ................. 430/191, 430/192, 193, 270.1, 311, 325, 330
See application file for complete search history.

(56) References Cited

U.S. PATENT DOCUMENTS

| 6,096,480 | A * | 8/2000 | Ishikawa et al. | 430/283.1 |
| 7,407,731 | B2 * | 8/2008 | Naiini et al. | 430/18 |
| 7,416,822 | B2 * | 8/2008 | Kanada et al. | 430/18 |
| 7,485,405 | B2 * | 2/2009 | Kato et al. | 430/270.1 |
| 2005/0272907 | A1 | 12/2005 | Jin et al. | |
| 2007/0248910 | A1 * | 10/2007 | Kimura et al. | 430/270.1 |

FOREIGN PATENT DOCUMENTS

| JP | A-11-202488 | 7/1999 |
| JP | A-2001-330953 | 11/2001 |
| JP | A-2004-280104 | 10/2004 |
| JP | A-2005-215035 | 8/2005 |
| WO | WO 03/060010 A1 | 7/2003 |
| WO | WO 2004/114020 A1 | 12/2004 |

* cited by examiner

*Primary Examiner*—John S Chu
(74) *Attorney, Agent, or Firm*—Oliff & Berridge, PLC

(57) ABSTRACT

The developability of a photosensitive polyimide resin composition with a weakly alkaline aqueous solution is improved without reduction in the solubility in general-purpose organic solvents even when a part of the diamine component is replaced with a diaminopolysiloxane-based compound or a bis(aminobenzoate)-based compound in order to reduce the warpage characteristics of the photosensitive polyimide resin composition by reducing its modulus of elasticity. The photosensitive polyimide resin composition is capable of being developed in a positive manner with a weakly alkaline aqueous solution and is soluble in an organic solvent. The photosensitive polyimide resin composition contains: a polyimide resin including a polyimide unit represented by formula (1) and a polyimide unit represented by one of formulas (2) and (3); an analogue of melamine cyanurate; and an analogue of diazonaphthoquinone. The amount of the analogue of melamine cyanurate is in the range of from 5 to 50 parts by weight with respect to 100 parts by weight of the polyimide resin.

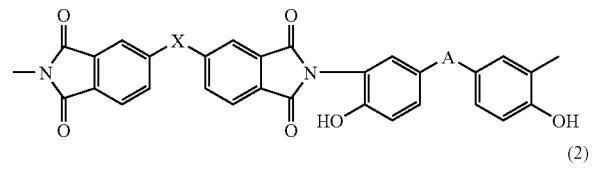

(1)

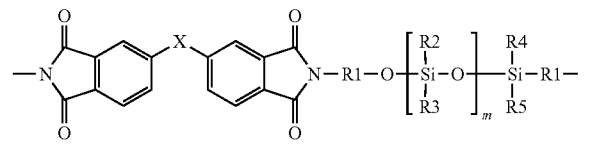

(2)

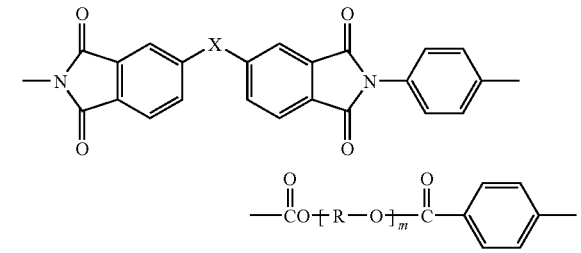

(3)

12 Claims, No Drawings

PHOTOSENSITIVE POLYIMIDE RESIN COMPOSITION

TECHNICAL FIELD

The present invention relates to a photosensitive polyimide resin composition. In particular, the present invention relates to a photosensitive polyimide resin composition that can be developed in a positive manner with a weakly alkaline aqueous solution such as an aqueous sodium carbonate solution and is soluble in general-purpose organic solvents such as amide-based solvents, lactone-based solvents, sulfoxide-based solvents, and ether-based solvents. The present invention also relates to a method for manufacturing a flexible printed circuit having a positive-type pattern formed of the photosensitive polyimide resin composition.

BACKGROUND ART

Photosensitive polyimide resin compositions that can be developed with an alkaline aqueous solution to form a positive-type pattern have widely been used as materials for overcoat layers and interlayer insulating films of flexible printed circuits, sealing materials for use in IC chips, and the like. Polyimide resins have nitrogen atoms in their molecules and therefore have better flame retardancy than acrylic resins, epoxy resins, and other resins. Also from this point of view, the use of polyimide resins is recommended for such applications.

The above-described photosensitive polyimide resin compositions contain diazonaphthoquinone and a polyimide resin obtained through dehydration reaction of an aromatic diamine with an aromatic acid dianhydride having a phenolic hydroxyl group (Patent Document 1). Diazonaphthoquinone acts on the phenolic hydroxyl group in the polyimide resin to suppress the solubility of the polyimide resin in an alkaline aqueous solution. However, when irradiated with light, diazonaphthoquinone decomposes to form a ketene group and then reacts with water to form a carboxyl group. Therefore, the solubility in an alkaline aqueous solution is largely different between the exposed and unexposed areas in a thin film of the photosensitive polyimide resin composition. The exposed area can thereby be removed by developing the thin film with such an alkaline aqueous solution, whereby a positive-type pattern of the photosensitive polyimide resin composition can be formed.

[Patent Document 1] Japanese Patent Application Laid-Open No. Hei 11-202488.

DISCLOSURE OF THE INVENTION

Problems to be Solved by the Invention

When an exposed thin film of a photosensitive polyimide resin composition is developed, an aqueous solution of tetrametylhydroxyammonium hydroxide (TMAH) is generally used in order to form a fine pattern in a shorter period of time. However, the alkali concentration of the aqueous solution of tetramethylhydroxyammonium hydroxide is difficult to control, and the aqueous solution is not always considered to be safe for humans. Therefore, there is a demand for a photosensitive polyimide resin composition that can be developed with a weakly alkaline aqueous solution such as an aqueous sodium carbonate solution.

When used in a flexible wiring circuit, a photosensitive polyimide resin composition is required to have low warpage characteristics. In order to obtain the low warpage characteristics, it is effective to reduce the modulus of elasticity of the polyimide resin. More specifically, an attempt has been made to reduce the modulus of elasticity by replacing a part of the diamine component with a diaminopolysiloxane-based compound or a bis(aminobenzoate)-based compound.

However, if the modulus of elasticity of a photosensitive polyimide resin composition is reduced in a manner described above, a problem arises in that the developability with a weakly alkaline aqueous solution decreases.

The present invention has been made to solve the above problems in the conventional technology. It is therefore an object of the invention to improve the developability of a photosensitive polyimide resin composition with a weakly alkaline aqueous solution without reduction in the solubility in general-purpose organic solvents even when a part of the diamine component is replaced with a diaminopolysiloxane-based compound or a bis(aminobenzoate)-based compound in order to reduce the warpage characteristics of the photosensitive polyimide resin composition by reducing its modulus of elasticity.

Means for Solving the Problems

The present inventor has prepared a photosensitive polyimide resin composition having a reduced modulus of elasticity by replacing a part of the diamine component with a diaminopolysiloxane-based compound or a bis(aminobenzoate)-based compound and adding to the composition a predetermined amount of a specific compound that is conventionally used as a flame retardant. The inventor has unexpectedly found that such a photosensitive polyimide resin composition can be developed with a weakly alkaline aqueous solution while the solubility in general-purpose organic solvents is maintained at the same level. Thus, the present invention has been completed.

Accordingly, the present invention provides a photosensitive polyimide resin composition capable of being developed in a positive manner with a weakly alkaline aqueous solution and soluble in an organic solvent, the photosensitive polyimide resin composition including: a polyimide resin including a polyimide unit represented by the following formula (1) and a polyimide unit represented by one of the following formulas (2) and (3); an analogue of melamine cyanurate; and an analogue of diazonaphthoquinone; wherein an amount of the analogue of melamine cyanurate is in a range of from 5 to 50 parts by weight with respect to 100 parts by weight of the polyimide resin.

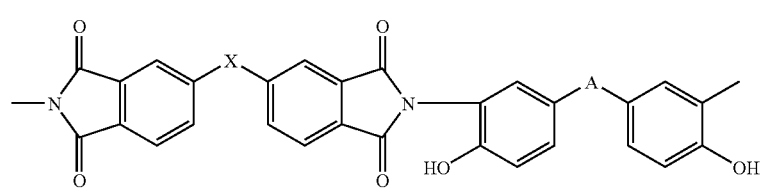

(1)

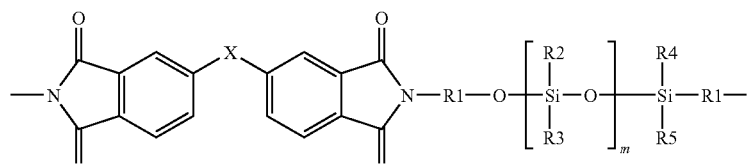

(2)

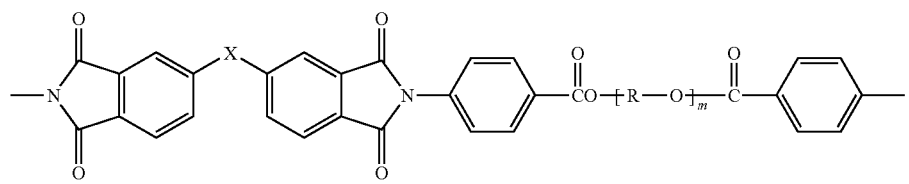

(3)

In the formulas (1) to (3), X and A are each independently a single bond or a divalent organic group, R1 is an alkylene group having 3 to 9 carbon atoms, R2, R3, R4, and R5 are each independently an alkylene group having 1 to 8 carbon atoms or an aromatic group, R is an alkylene group having 2 to 50 carbon atoms or a polyalkylene oxide group, and m is an integer equal to or greater than 2.

The present invention also provides a method for manufacturing a flexible printed circuit having a positive-type pattern of polyimide, the method including: depositing the above photosensitive polyimide resin composition on a flexible printed circuit to form a photosensitive polyimide resin film; irradiating the photosensitive polyimide resin film with light that decomposes the analogue of diazonaphthoquinone to thereby form a latent image; removing an exposed portion of the photosensitive polyimide resin film by developing the photosensitive polyimide resin film in a positive manner with a weakly alkaline aqueous solution to thereby form a positive-type pattern of the photosensitive polyimide resin; and post-baking the photosensitive polyimide resin film.

Effects of the Invention

In the photosensitive polyimide resin composition of the present invention, a part of the diamine component is replaced with a diaminopolysiloxane-based compound or a bis(aminobenzoate)-based compound. Therefore, the modulus of elasticity of the composition of the present invention is lower than that of a photosensitive polyimide resin composition in which the diamine component is not replaced. Moreover, since the composition of the present invention contains a specific amount of an analogue of melamine cyanurate that is conventionally used as a flame retardant, the composition of the present invention can be developed with a weakly alkaline aqueous solution. In addition, the solubility of the composition of the present invention in general-purpose organic solvents can be maintained at the same level.

BEST MODE FOR CARRYING OUT THE INVENTION

The photosensitive polyimide resin composition of the present invention is a photosensitive polyimide resin composition capable of being developed in a positive manner with a weakly alkaline aqueous solution and soluble in an organic solvent. The photosensitive polyimide resin composition includes: a polyimide resin including a polyimide unit represented by the above-mentioned formula (1) and a polyimide unit represented by one of the formulas (2) and (3); an analogue of melamine cyanurate; and an analogue of diazonaphthoquinone. In the present invention, the amount of the analogue of melamine cyanurate is in the range of from 5 to 50 parts by weight and preferably in the range of from 30 to 50 parts by weight with respect to 100 parts by weight of the polyimide resin. Disadvantageously, when the amount of the analogue of melamine cyanurate is less than 5 parts by weight, difficulty arises in development with a weakly alkaline aqueous solution. When the amount thereof exceeds 50 parts by weight, a reduction in film thickness occurs. When the analogue of melamine cyanurate is added in an amount of 25 parts by weight or more, UL-94 V-0 flame retardancy can be imparted to the photosensitive polyimide resin composition.

Specific examples of the analogue of melamine cyanurate include at least one selected from among melamine, cyanuric acid, adducts of melamine and isocyanuric acid, and melamine derivatives listed below and cyanuric acid derivatives listed below. These may be used as a mixture of two or more. Of these, the adducts of melamine and isocyanuric acid, triazinethiol diol, tris(2-hydroxyethyl)isocyanurate are preferred because of their good dispersibility.

(melamine derivatives)

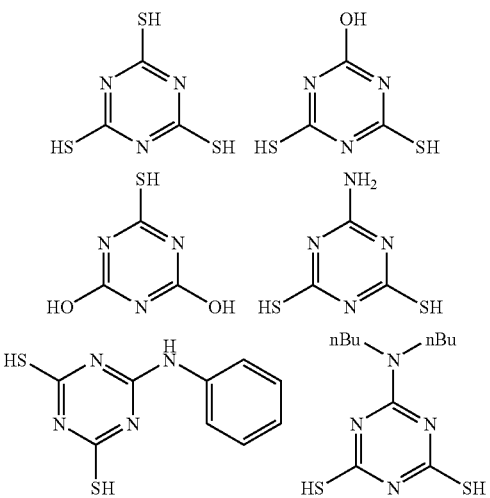

-continued

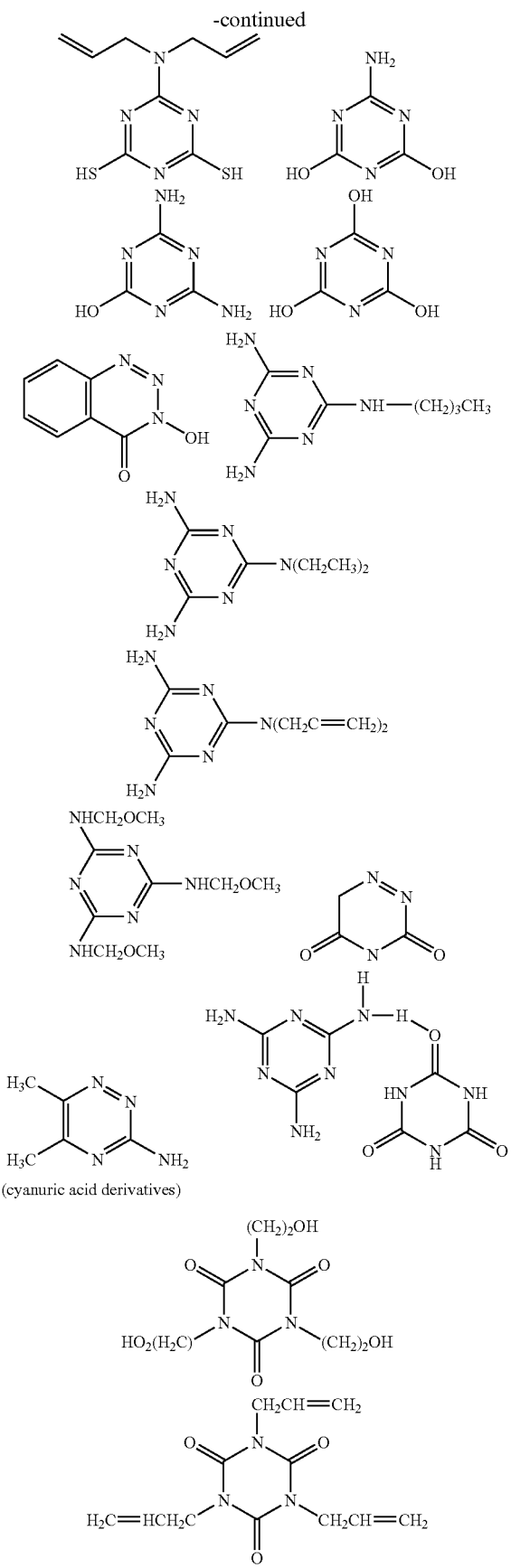

(cyanuric acid derivatives)

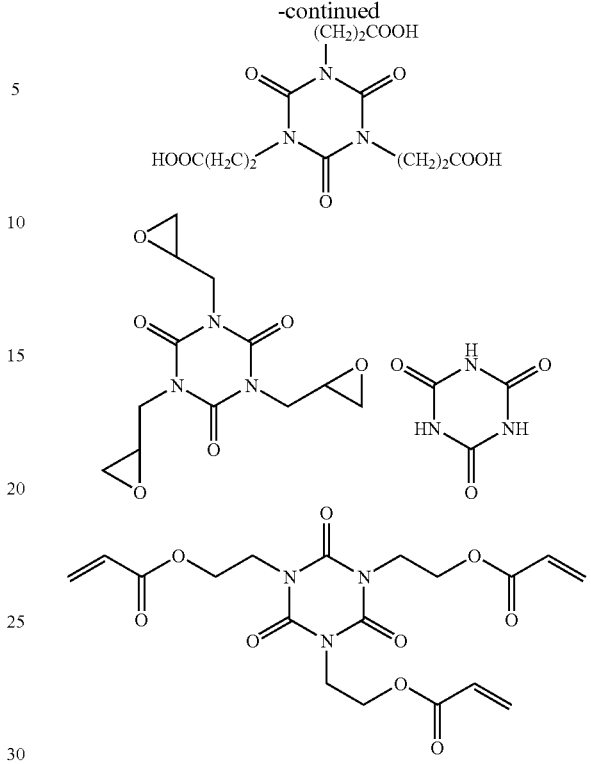

The polyimide resin included in the photosensitive polyimide resin composition of the present invention is composed of the polyimide unit represented by the formula (1) and the polyimide unit represented by one of the formulas (2) and (3).

The polyimide unit represented by the formula (1) is composed of an aromatic acid dianhydride and an aromatic diamine having a phenolic hydroxyl group and strongly contributes to the solubility in an alkaline aqueous solution. The polyimide unit represented by the formula (2) is composed of an aromatic acid dianhydride and a diaminopolysiloxane-based compound, and the polyimide unit represented by the formula (3) is composed of an aromatic acid dianhydride and a bis(aminobenzoate)-based compound. Both the polyimide units contribute to a reduced modulus of elasticity, i.e., reduced warpage characteristics.

When the ratio of the polyimide unit represented by the formula (1) to the polyimide unit represented by one of the formulas (2) and (3) is high, alkali solubility increases under the presence of the analogue of melamine cyanurate. Therefore, the inventive composition can be satisfactorily developed with a weakly alkaline aqueous solution (with high resolution in a shorter period of time). However, since the relative amount of the polyimide unit represented by one of the formulas (2) and (3) decreases, the warpage characteristics cannot be reduced. When the ratio of the polyimide unit represented by the formula (1) to the polyimide unit represented by one of the formulas (2) and (3) is low, the developability with a weakly alkaline aqueous solution is reduced. However, the warpage characteristics can be reduced. Therefore, the molar ratio of the polyimide unit represented by the formula (1) to the polyimide unit represented by one of the formulas (2) and (3) is in the range of from 1:0.1 to 2.3 and preferably in the range of from 1:0.4 to 1.7.

For example, if a polyimide resin film has an initial tensile modulus of elasticity of 500 MPa or less, the warpage characteristics are considered to be low enough for practical use. When the initial tensile modulus of elasticity is greater than 500 MPa, the "warpage" of the photosensitive polyimide resin formed on a conductive material or a polymer base material is not negligible, and a particular base material can cause a formed film to be rolled into a pencil shape.

In the polyimide unit represented by the formula (1), X represents a single bond or a divalent organic group. Preferred examples of the divalent organic group include di(trifluoromethyl)methylene, sulfo, carbonyl, dimethylmethylene, oxygen atom, and fluorene-9,9-diyl. A represents a single bond or a divalent organic group. Preferred examples of the divalent organic group include di(trifluoromethyl)methylene, sulfo, carbonyl, oxymethylene, dimethylmethylene, fluorene-9,9-diyl, and methylene.

Preferred examples of X in the polyimide unit represented by the formula (2) are the same as the preferred examples of X in the formula (1) described above. Preferred examples of R1 include methylene, ethylene, propylene, 3-methylphenylene, and butylene. Preferred examples of each of R2, R3, R4, and R5 include methyl and phenyl. m is an integer equal to or greater than 2 and preferably an integer from 10 to 20.

Preferred examples of X in the polyimide unit represented by the formula (3) are the same as the preferred examples of X in the formula (1) described above. Preferred examples of R include trimethylene, tetramethylene, polytetramethyleneoxide, and poly[(tetramethylene/3-methyltetramethylene ether)oxide]. m is an integer equal to or greater than 2 and preferably an integer from 2 to 20.

In a particularly preferred exemplary structure of the polyimide resin, the polyimide resin includes the polyimide unit represented by the formula (1) and the polyimide unit represented by the formula (2); X and A in the formula (1) are both sulfo; X in the formula (2) is sulfo; R1 is methylene; each of R2 to R5 is methyl; and m is an integer from 10 to 20. In another particularly preferred exemplary structure of the polyimide resin, the polyimide resin includes the polyimide unit represented by the formula (1) and the polyimide unit represented by the formula (3); X in the formula (1) is a single bond; A is di(trifluoromethyl)methylene; X in the formula (3) is a single bond; R is tetramethylene; and m is an integer from 2 to 20.

Preferred specific examples of the aromatic acid dianhydride included in each of the polyimide units represented by the formulas (1) to (3) are shown below.

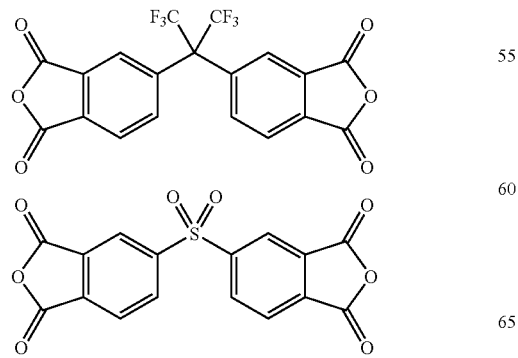

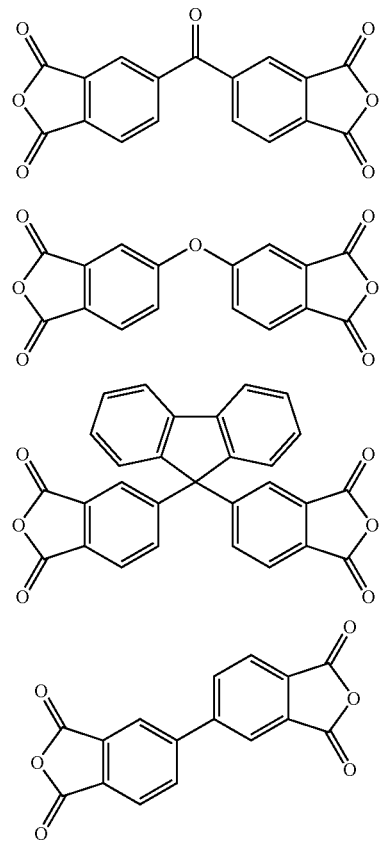

Preferred specific examples of the aromatic diamine included in the polyimide unit represented by the formula (1) are shown below.

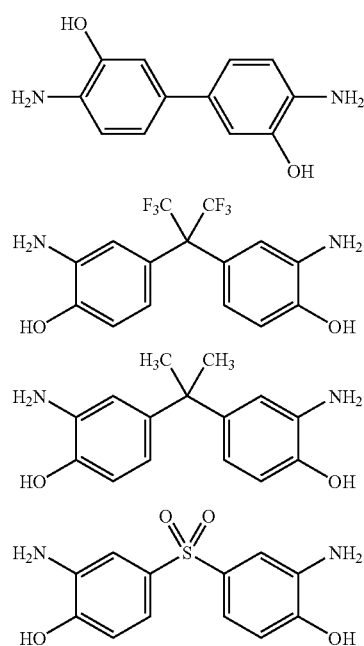

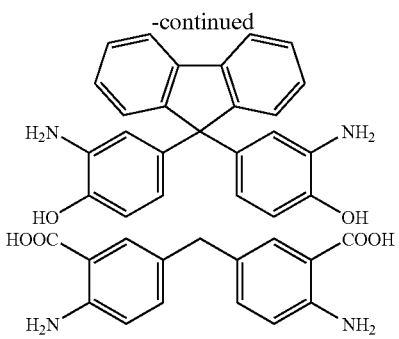

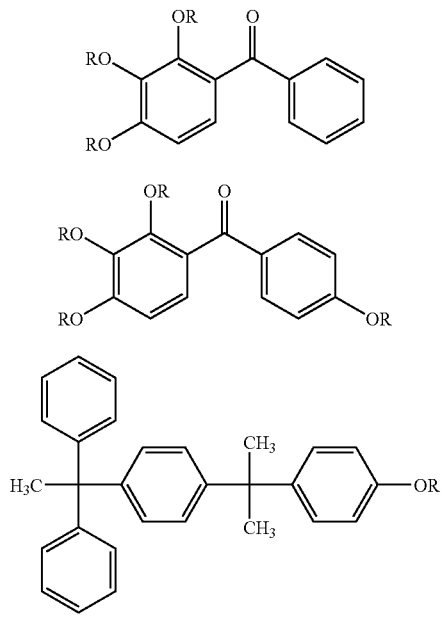

Preferred specific examples of the diaminopolysiloxane-based compound included in the polyimide unit represented by the formula (2) include α,ω-bis(2-aminoethyl)polydimethylsiloxane, α,ω-bis(3-aminopropyl)polydimethylsiloxane, α,ω)-bis(3-amino-3-methylphenyl)polydimethylsiloxane, α,ω-bis(3-aminopropyl)polydiphenylsiloxane, and α,ω-bis (4-aminobutyl)polydimethylsiloxane.

Preferred specific examples of the bis(aminobenzoate)-based compound included in the polyimide unit represented by the formula (3) are shown below. l is preferably an integer from 1 to 20, q is preferably an integer from 1 to 20, and n is preferably an integer from 1 to 20.

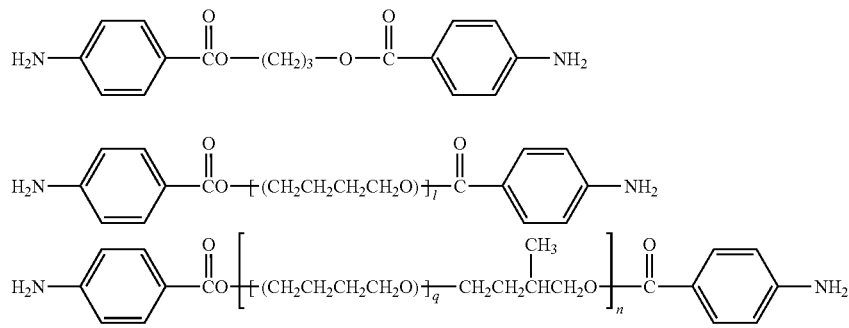

The photosensitive polyimide resin composition of the present invention contains an analogue of diazonaphthoquinone as an essential ingredient in order to impart photosensitivity thereto. When the amount of the analogue of diazonaphthoquinone is too low, difficulty arises in development. When the amount is too large, film properties deteriorate. The amount added of the analogue of diazonaphthoquinone is preferably in the range of from 10 to 50 parts by weight and more preferably in the range of from 10 to 30 parts by weight with respect to 100 parts by weight of the polyimide resin.

Preferred specific examples of the analogue of diazonaphthoquinone include, but not limited to: diazonaphthoquinone (DNQ); and esters of 1,2-naphthoquinone-2-diazido-5-sulfonic acid and 1,2-naphthoquinone-2-diazido-4-sulfonic acid with 4,4'hydroxypropane and low molecular weight aromatic hydroxy compounds such as 2,3,4-trihydroxybenzophenone, 1,3,5-trihydroxybenzene, and 2- and 4-methylphenol. Particularly preferred examples of the analogue of diazonaphthoquinone include compounds having the following structure.

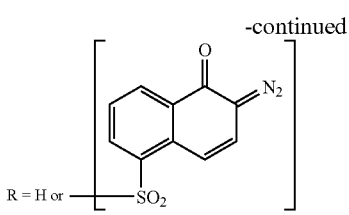

The photosensitive polyimide resin composition of the present invention may further contain an organic solvent. The inventive composition dissolved in the organic solvent can be preferably used as a varnish. Examples of such an organic solvent include: amide solvents such as N,N-dimethylacetamide, N,N-diethylacetamide, N,N-dimethylformamide, N,N-diethylformamide, and N-methyl-2-pyrrolidone; lactone solvents such as γ-butyrolactone and γ-valerolactone; sulfur-containing solvents such as dimethylsulfoxide, diethylsulfoxide, and hexamethylsulfoxide; phenolic solvents such as cresol and phenol; and ether solvents such as diethylene glycol dimethyl ether (diglyme), triethylene glycol dimethyl ether (triglyme), tetraglyme, dioxane, and tetrahydrofuran. These may be used alone or in combination of two or more. Of these, N-methyl-2-pyrrolidone, γ-butyrolactone, and triglyme can be preferably used.

The photosensitive polyimide resin composition of the present invention can be produced by producing the polyimide resin, adding to the produced polyimide resin the analogue of melamine cyanurate and the analogue of diazonaphthoquinone, and mixing the resultant mixture uniformly. Preferably, when the polyimide resin is produced, the organic solvent is used to dissolve the ingredients. The polyimide resin solution can be obtained as follows. The above-described aromatic acid dianhydride (hereinbelow also referred to as an acid dianhydride monomer), the aromatic diamine, and the diaminopolysiloxane-based compound and/or the bis(aminobenzoate)-based compound (hereinbelow also referred to as a diamine monomer) are addition-polymerized in the above-described organic solvent to form a polyimide precursor. Subsequently, the polyimide precursor is subjected to cyclodehydration reaction (thermal imidization in a solution or chemical imidization using a dehydrating agent).

In an exemplary method for preparing the inventive composition from the polyimide precursor, an azeotropic agent such as toluene or xylene is added to the polyimide precursor under nitrogen flow. Then, the mixture is heat to 180° C. or higher under stirring to subject the polyimide precursor (polyamic acid) to dehydration reaction, whereby the entire polyamic acid is subjected to ring closure to form the polyimide component. If necessary, a tertiary amine such as triethylamine, a basic catalyst such as aromatic isoquinoline or pyridine, or an acidic catalyst such as benzoic acid or p-hydroxybenzoic acid may be added as an imidization catalyst. These catalysts may be added alone or in combination of two or more.

The polyamic acid can be subjected to ring closure by using a chemical imidizing agent such as an acetic anhydride-pyridine mixture (cyclodehydration reagent) or dicyclohexylcarbodiimide. The polyimide can be obtained in a single step through cyclodehydration reaction without the formation of the polyimide precursor.

Preferably, the number average molecular weight of the thus synthesized polyimide resin is 5,000 or more. When the number average molecular weight is less than 5,000, the degree of polymerization of the polyimide resin is too small, and therefore the polyimide resin film does not have a sufficient film strength. The molecular weight can be controlled by changing the molar ratio of the acid anhydride monomer to the diamine monomer. The preferred molar ratio is in the range of from 1:0.8 to 1.2. When the molar ratio falls outside the above range, the degree of polymerization is reduced, and therefore a sufficient film strength may not be obtained. Moreover, an end-capping agent such as phthalic anhydride or aniline can be effectively used to control the molecular weight.

The constitutional unit of the polyimide can be blocked as follows. First, an oligoimide compound (oligoimide monomer) having a reactive end (an amino group or acid anhydride group) is formed using a solution imidizing method or other method. Then, stoichiometric amounts of the acid dianhydride monomer and the diamine monomer are added, and the mixture is subjected to. cyclodehydration reaction.

The thus obtained photosensitive polyimide resin composition of the present invention is soluble to general-purpose organic solvents and can be developed to form a positive-type pattern. Therefore, the inventive composition can be advantageously used as materials for overcoat layers and interlayer insulating films of flexible printed circuits, sealing materials for use in IC chips, and the like. For example, the inventive composition can be used for manufacturing a flexible printed circuit having a positive-type pattern of polyimide. Specifically, first, the photosensitive polyimide resin composition is applied to a flexible printed circuit by a known application method such as a spin coating method or a doctor blade method. If necessary, the applied composition is dried at a temperature at which the analogue of diazonaphthoquinone does not decompose to thereby form a film. The obtained photosensitive polyimide resin film is irradiated through a pattern mask with light, such as light from a high-pressure mercury-vapor lamp, that decomposes the analogue of diazonaphthoquinone to thereby form a latent image. The irradiated film is then immersed in a weakly alkaline aqueous solution such as an aqueous sodium carbonate solution or is showered with the weakly alkaline aqueous solution to develop the photosensitive polyimide resin composition in a positive manner. The exposed portion of the photosensitive polyimide resin film is thereby removed, and a positive-type pattern of the photosensitive polyimide resin is formed. Subsequently, post-baking treatment is performed, whereby a flexible printed circuit having the positive-type pattern of polyimide can be obtained.

EXAMPLES

Hereinbelow, the present invention is more specifically described by way of examples.

Example 1 and Comparative Examples 1 to 3

3,4,3',4'-Biphenyl tetracarboxylic acid dianhydride (BPDA), 2,2-bis(3-amino-4-hydroxyphenyl)-1,1,1,3,3,3-hexafluoropropane (Bis-AP-AF), and polytetramethyleneoxide-di-p-aminobenzoate (Elastomer 1000, Ihara Chemical Industry Co., Ltd.) in amounts shown in Table 1 were dissolved in 0.24 L of a solvent (N-methyl pyrrolidone (NMP)). The mixture was subjected to cyclodehydration reaction by stirring the mixture at 80° C. for 2 hours and then stirring at 180° C. for 5 hours, whereby a polyimide resin (PI) solution was obtained.

Diazonaphthoquinone (DNQ) serving as a photosensitizing agent and, if necessary, an adduct of melamine and isocyanuric acid (MC-860, Nissan Chemical Industries Ltd.) serving as a developing aid or $Al(OH)_3$ serving as a flame retardant in amounts shown in Table 1 were added to the obtained polyimide resin solution (resin content: 20 percent by weight). Subsequently, the mixture was uniformly mixed, whereby a varnish was prepared.

The obtained varnish was applied to a metal foil so as to have a thickness of 10 μm after drying and was dried in an electric furnace at 100° C., whereby a photosensitive polyimide resin film was formed.

<Evaluation of Developability>

The formed photosensitive polyimide resin film was exposed through a line-and-space mask with a pitch of 300 μm to light from a high-pressure mercury-vapor lamp at a light quantity of 100 mW/cm² and an integrated light quantity of 2,500 mJ/cm². Subsequently, the exposed film was developed with a 10% aqueous sodium carbonate solution at 50° C. using a dipping method. The developed film was evaluated as "developable" ("G") when lines and spaces at a pitch of 300 μm were formed after 90 seconds of development. The developed film was evaluated as "not developable" ("NG") when lines and spaces at a pitch of 300 μm were not formed after 90 seconds of development. The results obtained are shown in Table 1.

TABLE 1

|  |  | Ex. 1 | Comp. Ex. 1 | Comp. Ex. 2 | Comp. Ex. 3 |
|---|---|---|---|---|---|
| BPDA | Acid dianhydride monomer (mol %) | 101 | 101 | 101 | 101 |
| Bis-AP-AF | Diamine monomer (mol %) | 70 | 70 | 70 | 70 |
| Elastomer 1000 | Diamine monomer (mol %) | 30 | 30 | 30 | 30 |
| PI | Polyimide resin (parts by weight) | 100 | 100 | 100 | 100 |
| DNQ | Photosensitizing agent (parts by weight) | 20 | 20 | 20 | 20 |
| MC-860 | Developing aid (parts by weight) | 50 | — | — | — |
| Al(OH)$_3$ | Flame retardant (parts by weight) | — | — | 100 | 50 |
| Developability | 10% Na$_2$CO$_3$, 50° C. | G | NG | NG | NG |

As can be seen from Table 1, although the same polyimide resin was used in Example 1 and Comparative Examples 1 to 3, good developability with the weakly alkaline aqueous solution was obtained only in Example 1 in which the adduct of melamine and isocyanuric acid, which is conventionally used as a flame retardant, was used as the developing aid.

Examples 2 to 6, and Comparative Example 4

3,4,3',4'-Diphenylsulfonetetracarboxylic dianhydride (DSDA), diaminopolysiloxane (X-22-9409, Shin-Etsu Chemical Co., Ltd), and 3,3'-diamino-4,4'-dihydrophenyl sulfone (BS-DA) in amounts shown in Table 2 were dissolved in 0.21 L of a solvent (N-methyl pyrrolidone (NMP)). The mixture was subjected to cyclodehydration reaction by stirring the mixture at 80° C. for 2 hours and then stirring at 180° C. for 5 hours, whereby a polyimide resin (PI) solution was obtained.

Diazonaphthoquinone (DNQ, 4NT-300, Toyo Gosei Co., Ltd.) serving as a photosensitizing agent; an adduct of melamine and isocyanuric acid (MC-860, Nissan Chemical Industries Ltd.), triazine thiol diol (TA-07, Showa Kako Corporation), or tris(2-hydroxyethyl)isocyanurate (THI, Tokyo Chemical Industry Co., Ltd.) serving as a developing aid; and an anticorrosive (CDA-6, ADEKA Corporation) in amounts shown in Table 2 were added to the obtained polyimide resin solution (resin content: 47% by weight). Subsequently, the mixture was uniformly mixed, whereby a varnish was prepared. The ratio of NMP in the varnish was 55% by weight.

The obtained varnish was applied to a metal foil so as to have a thickness of 10 μm after drying and was dried in an electric furnace at 100° C., whereby a photosensitive polyimide resin film was formed.

<Evaluation of Developability>

The formed photosensitive polyimide resin film was exposed through a line-and-space mask with a pitch of 300 μm to light from a high-pressure mercury-vapor lamp at a light quantity of 100 mW/cm$^2$ and an integrated light quantity of 2,500 mJ/cm$^2$. Subsequently, the exposed film was developed with a 10% aqueous sodium carbonate solution at 40° C. using a dipping method. The developed film was evaluated as "developable" ("G") when lines and spaces at a pitch of 300 μm were formed after 90 seconds of development. The developed film was evaluated as "not developable" ("NG") when lines and spaces at a pitch of 300 μm were not formed after 90 seconds of development. The results obtained are shown in Table 2. Note that the remaining thickness of the film was 10 μm for Examples 2 to 6 and Comparative Example 4.

TABLE 2

|  |  | Ex. 2 | Ex. 3 | Ex. 4 | Ex. 5 | Ex. 6 | Comp. Ex. 4 |
|---|---|---|---|---|---|---|---|
| DSDA | Acid dianhydride monomer (mol %) | 101 | 101 | 101 | 101 | 101 | 101 |
| X-22-9409 | Diaminopolysiloxane monomer (mol %) | 36.7 | 36.7 | 36.7 | 36.7 | 36.7 | 36.7 |
| BS-DA | Diamine monomer (mol %) | 63.3 | 63.3 | 63.3 | 63.3 | 63.3 | 63.3 |
| Ratio of amount of diaminopolysiloxane monomer to total amount of monomers (% by weight) |  | 65 | 65 | 65 | 65 | 65 | 65 |
| PI | Polyimide resin (parts by weight) | 100 | 100 | 100 | 100 | 100 | 100 |
| 4NT-300 | Photosensitizing agent (parts by weight) | 20 | 20 | 20 | 20 | 20 | 20 |
| CDA-6 | Anticorrosive (parts by weight) | 0.3 | 0.3 | 0.3 | 0.3 | 0.3 | 0.3 |
| MC-860 | Developing aid (parts by weight) | 50 | 5 | 30 | — | — | — |
| TA-07 | Developing aid (parts by weight) | — | — | — | 30 | — | — |
| THI | Developing aid (parts by weight) | — | — | — | — | 30 | — |
| Developability | 10% Na$_2$CO$_3$, 40° C. | G | G | G | G | G | NG |

As can be seen from Table 2, the photosensitive polyimide resin compositions of Examples 2 to 6 in which the amount of the analogue of melamine cyanurate is 5 to 50 parts by weight with respect to 100 parts by weight of the polyimide resin exhibited good developability with the weakly alkaline aqueous solution.

INDUSTRIAL APPLICABILITY

The photosensitive polyimide resin composition of the present invention is soluble in general-purpose organic solvents and can be developed to form a positive-type pattern. Therefore, the inventive composition can be advantageously used as materials for overcoat layers and interlayer insulating films of flexible printed circuits, sealing materials for use in IC chips, and the like.

The invention claimed is:

1. A photosensitive polyimide resin composition capable of being developed in a positive manner with a weakly alkaline aqueous solution and soluble in an organic solvent, the photosensitive polyimide resin composition comprising: a polyimide resin including a polyimide unit represented by the following formula (1) and a polyimide unit represented by one of the following formulas (2) and (3); an analogue of melamine cyanurate; and an analogue of diazonaphthoquinone;

wherein an amount of the analogue of melamine cyanurate is in a range of from 5 to 50 parts by weight with respect to 100 parts by weight of the polyimide resin;

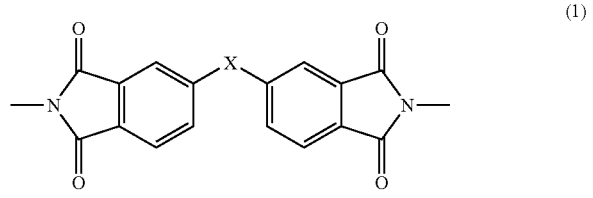

(1)

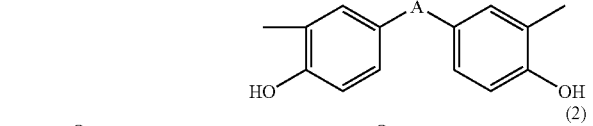

(2)

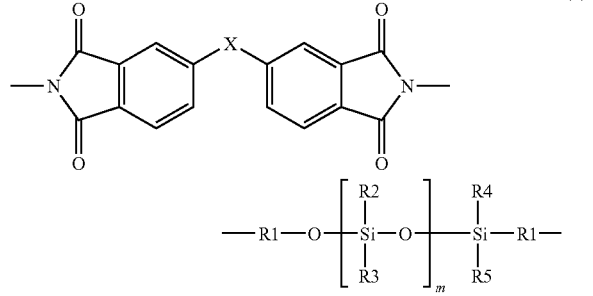

(3)

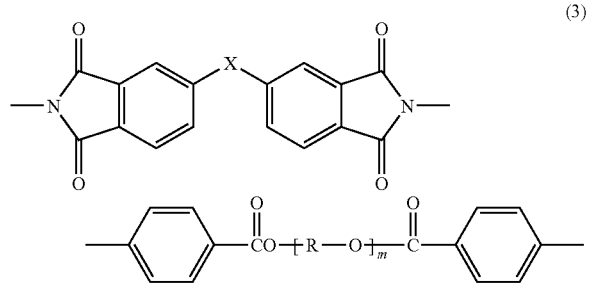

where, in the formulas (1) to (3), X and A are each independently a single bond or a divalent organic group, R1 is an alkylene group having 3 to 9 carbon atoms, R2, R3, R4, and R5 are each independently an alkylene group having 1 to 8 carbon atoms or an aromatic group, R is an alkylene group having 2 to 50 carbon atoms or a polyalkylene oxide group, and m is an integer equal to or greater than 2.

2. The photosensitive polyimide resin composition according to claim 1, wherein: the divalent organic group of X in the formula (1) is any of di(trifluoromethyl)methylene, sulfo, carbonyl, dimethylmethylene, an oxygen atom, and fluorene-9,9-diyl; and the divalent organic group of A is any of di(trifluoromethyl)methylene, sulfo, oxymethylene, dimethylmethylene, fluorene-9,9-diyl, and methylene.

3. The photosensitive polyimide resin composition according to claim 1, wherein: the divalent organic group of X in the formula (2) is any of di(trifluoromethyl)methylene, sulfo, carbonyl, dimethylmethylene, an oxygen atom, and fluorene-9,9-diyl; R1 is any of ethylene, propylene, 3-methylphenylene, and butylenes; R2, R3, R4, and R5 are each independently methyl or phenyl; and m is an integer from 2 to 20.

4. The photosensitive polyimide resin composition according to claim 1, wherein: the divalent organic group of X in the formula (3) is any of di(trifluoromethyl)methylene, sulfo, carbonyl, dimethylmethylene, an oxygen atom, and fluorene-9,9-diyl; R is any of trimethylene, tetramethylene, polytetramethyleneoxide, and poly[(tetramethylene/3-methyltetramethylene ether)oxide]; and m is an integer from 2 to 20.

5. The photosensitive polyimide resin composition according to claim 1, wherein: the polyimide resin comprises the polyimide unit represented by the formula (1) and the polyimide unit represented by the formula (2); X and A in the formula (1) are both sulfo; X in the formula (2) is sulfo; R1 is methylene; each of R2 to R5 is methyl; and m is an integer from 10 to 20.

6. The photosensitive polyimide resin composition according to claim 1, wherein: the polyimide resin comprises the polyimide unit represented by the formula (1) and the polyimide unit represented by the formula (3); X in the formula (1) is a single bond; A is di(trifluoromethyl)methylene; X in the formula (3) is a single bond; R is tetramethylene; and m is an integer from 2 to 20.

7. The photosensitive polyimide resin composition according to claim 1, wherein the analogue of melamine cyanurate is at least one selected from the group consisting of melamine, cyanuric acid, an adduct of melamine and isocyanuric acid, and melamine derivatives listed below,

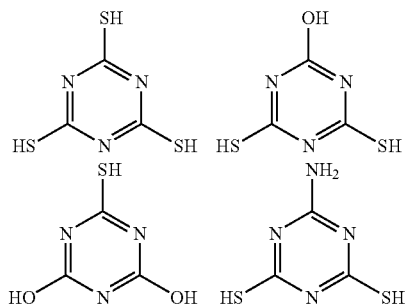

-continued

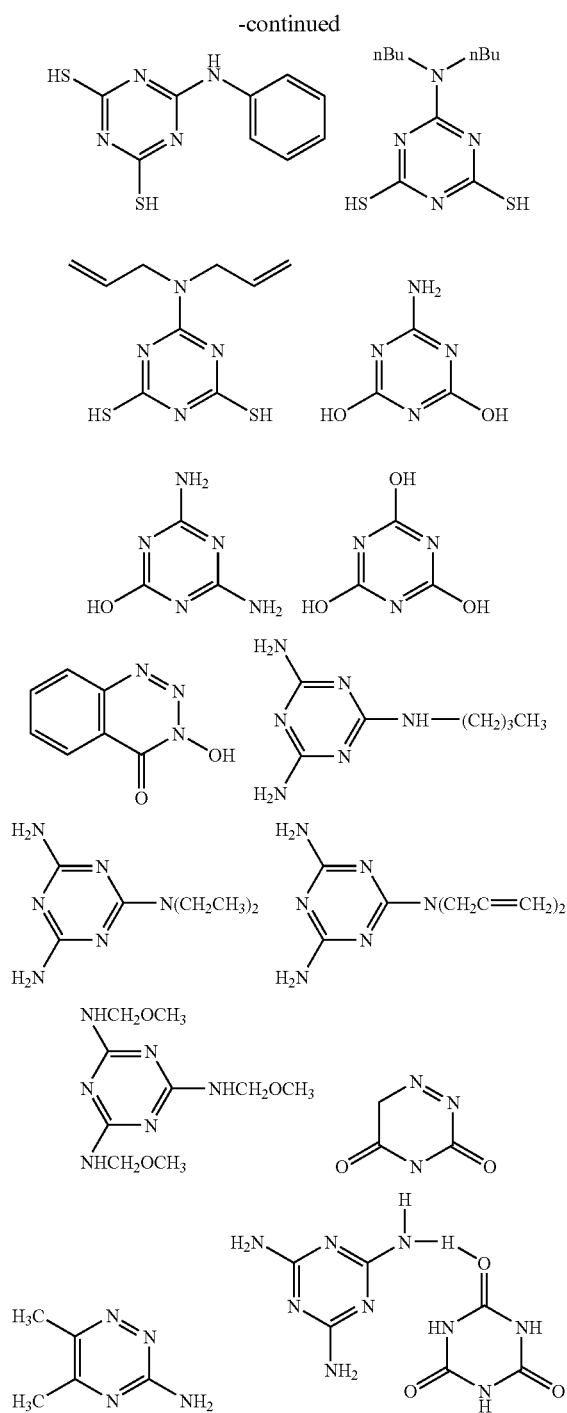

and cyanuric acid derivatives listed below,

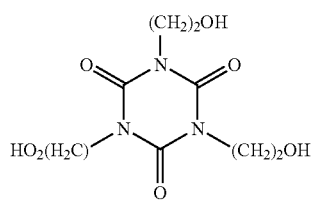

-continued

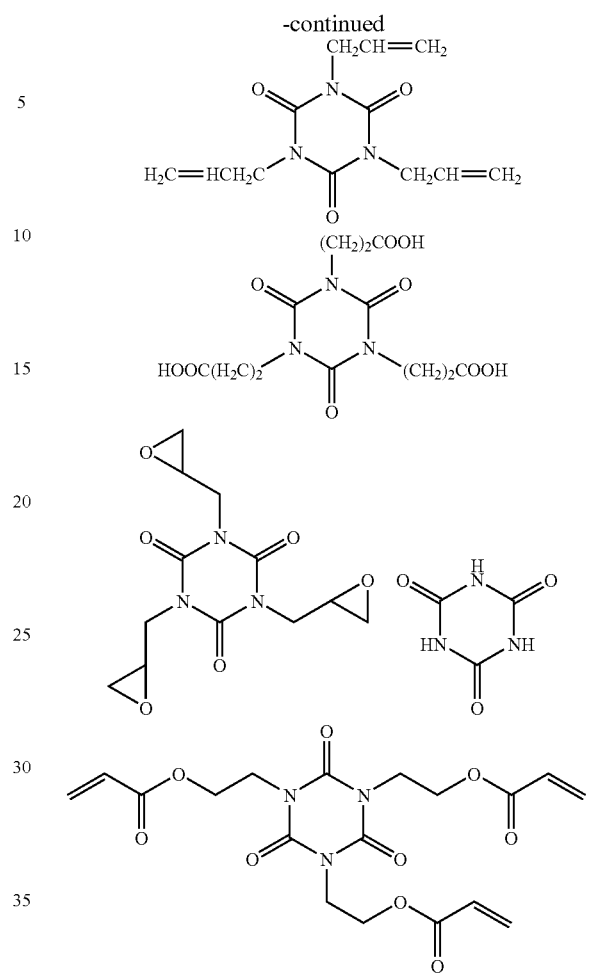

8. The photosensitive polyimide resin composition according to claim 7, wherein the analogue of melamine cyanurate is any of the adduct of melamine and isocyanuric acid, triazinethiol diol, and tris(2-hydroxyethyl)isocyanurate.

9. The photosensitive polyimide resin composition according to claim 1, wherein the analogue of diazonaphthoquinone is contained in an amount of from 10 to 50 parts by weight with respect to 100 parts by weight of the polyimide resin.

10. The photosensitive polyimide resin composition according to claim 1, wherein the analogue of diazonaphthoquinone is at least one type of diazonaphthoquinone derivatives represented by the following chemical structure:

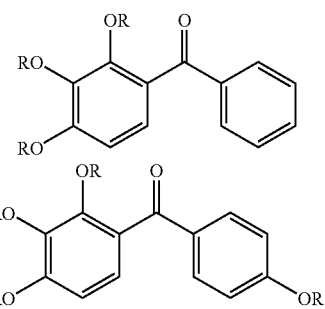

-continued

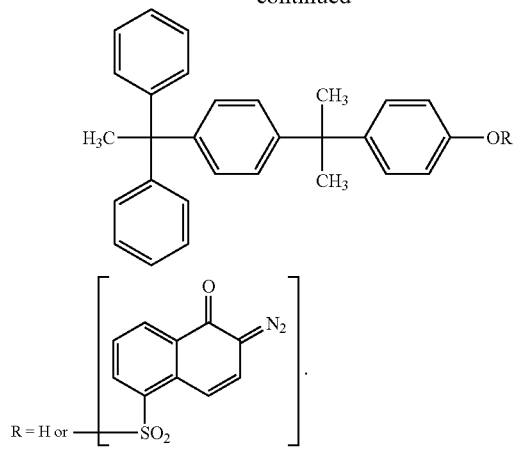

11. The photosensitive polyimide resin composition according to claim 1, further comprising an organic solvent to form a solution thereof.

12. A method for manufacturing a flexible printed circuit having a positive-type pattern of polyimide, the method comprising:
depositing the photosensitive polyimide resin composition according to claim 1 on a flexible printed circuit to form a photosensitive polyimide resin film;
irradiating the photosensitive polyimide resin film with light that decomposes the analogue of diazonaphthoquinone to form a latent image;
removing an exposed portion of the photosensitive polyimide resin film by developing the photosensitive polyimide resin film in a positive manner with a weakly alkaline aqueous solution to form a positive-type pattern of the photosensitive polyimide resin; and
post-baking the photosensitive polyimide resin film.

* * * * *